(12) United States Patent
Inada et al.

(10) Patent No.: US 6,670,873 B2
(45) Date of Patent: Dec. 30, 2003

(54) THIN SWITCH AND DISPLAY PANEL PROVIDED WITH SWITCH

(75) Inventors: Koji Inada, Osaka (JP); Rina Matsuda, Osaka (JP); Akito Okamoto, Osaka (JP)

(73) Assignee: Idec Izumi Corporation, Osaka (JP)

( * ) Notice: Subject to any disclaimer, the term of this patent is extended or adjusted under 35 U.S.C. 154(b) by 87 days.

(21) Appl. No.: 09/958,931

(22) PCT Filed: Feb. 15, 2001

(86) PCT No.: PCT/JP01/01079
§ 371 (c)(1),
(2), (4) Date: Oct. 16, 2001

(65) Prior Publication Data
US 2002/0153993 A1 Oct. 24, 2002

(30) Foreign Application Priority Data
Feb. 17, 2000 (JP) .......................... 2000-039710

(51) Int. Cl.[7] .................................. H01H 7/00
(52) U.S. Cl. ........................... 335/205; 200/314
(58) Field of Search ................ 200/314; 335/205, 335/206, 207

(56) References Cited
U.S. PATENT DOCUMENTS 3,644,856 A * 2/1972 Scott ........................ 335/207
4,453,148 A    6/1984 Norakidze et al.
5,568,367 A * 10/1996 Park ........................... 362/109
5,664,667 A *  9/1997 Kenmochi ................... 200/314
6,326,569 B1 * 12/2001 Ardrey et al. ............... 200/314

FOREIGN PATENT DOCUMENTS

| JP | 83631/1982 | 5/1982 |
| JP | 163643/1982 | 10/1982 |
| JP | 3-7862 | 2/1991 |
| JP | 9-259701 | 10/1997 |
| JP | 10-283873 | 10/1998 |

* cited by examiner

Primary Examiner—Lincoln Donovan
Assistant Examiner—Bernard Rojad
(74) Attorney, Agent, or Firm—McDermott, Will & Emery

(57) ABSTRACT

When pressing a pushbutton (12) in this thin switch (40), the pushbutton (12) rotates at a constant stroke until a lower end of this pushbutton (12) on the side of a permanent magnet (16) comes into contact with a lower display panel (22). Following this rotation, positional relation between the permanent magnet (16) and a Hall element integrated circuit (44) corresponding to this pushbutton (12) changes and the Hall element integrated circuit (44) detects change of a magnetic field by the permanent magnet (16), whereby the pressing operation of the pushbutton (12) is detected. When the pushing operation is canceled, the pushbutton (12) is returned to the original state due to attractive force of the permanent magnet (16) and a magnetic body (18).

3 Claims, 14 Drawing Sheets

(A) OFF (B) ON (A) ON (B) OFF (A) OFF (B) ON (A) ON (B) OFF (A) ON (B) OFF (A) OFF (B) ON (A) OFF (B) ON (A) OFF (B) ON (A) OFF (B) ON (A) ON (B) OFF

THIN SWITCH AND DISPLAY PANEL PROVIDED WITH SWITCH

FIELD OF THE INVENTION

The present invention relates to a thin switch employed for various types of control apparatuses, an FA (factory automation) apparatus, a vending machine, a ticket-vending machine, an information apparatus, a household electric appliance, a medical operating apparatus or the like and a display panel provided with a switch employing the same.

BACKGROUND OF THE INVENTION

Thin switches and display panels provided with switches employing the same, have already been proposed. As an example thereof, there is a thin switch having a structure obtained by superposing a thin switch on a display panel having an information display function.

This thin switch comprises at least one transparent or translucent pushbutton provided on a transparent or translucent touch panel (touch switch). This pushbutton rotates at a constant stroke for pressing and turning on the touch panel. As the touch panel, a resistor film type one is typically employed.

However, it cannot be said that the light transmittance of the touch panel employed for this conventional thin switch is sufficiently high but reflection or attenuation of light takes place when light is transmitted through the touch panel. Therefore, visibility of the display contents of the display panel lowers due to the presence of this touch panel.

In the touch panel, the operating temperature thereof is generally about 0° C. to 50° C., and the storage temperature is generally about −20° C. to 60°. Considering outdoor use or the environment in a transportation stage (for example, transportation by air mail, by surface mail or the like), it is definitely not excellent in environmental resistance.

Further, the touch panel is a switch utilizing contact between oppositely arranged transparent electrodes. Therefore, a contact part deteriorates due to use over long years, and this serves as the cause reducing the life.

In the touch panel, further, it is difficult to determine which pushbuttons are pressed when at least two points are simultaneously pressed, i.e., when a plurality of pushbuttons are simultaneously pressed, due to its structure whether the same is digital or analog.

SUMMARY OF THE INVENTION

The principal object of the present invention is to provide a thin switch capable of thinning the aforementioned thin switch, capable of attaining improvement of visibility of display contents of a display panel, having resistance against various environments, capable of attaining a long life, and capable of determining which pushbuttons are pressed also when a plurality of pushbuttons are simultaneously pressed and a display panel provided with a switch employing the same.

Accordingly, the present invention is directed to a thin switch, used in superposition on a display panel having an information display function in order to attain the aforementioned principal object, comprising a pushbutton movable in a press direction at a constant stroke and transparent or translucent, a bridge arranged in the vicinity of outer sides of at least two opposite edges of the pushbutton, a first permanent magnet provided on an end of the pushbutton on the side facing the bridge, a magnetic body or a second permanent magnet provided on an upper portion of the bridge opposed to the first permanent magnet and a Hall element integrated circuit provided on the bridge on the side facing the first permanent magnet in correspondence to the pushbutton, while the magnetic body or the second permanent magnet structures return means generating returning force in the pushbutton by attractive force generated between the same and the first permanent magnet while causing a click feeling when pressing the pushbutton along with the first permanent magnet, and the Hall element integrated circuit has a Hall element and a determination circuit determining whether or not its Hall voltage is larger than a threshold, for detecting change of a magnetic field by the first permanent magnet provided on the pushbutton when pressing the corresponding said pushbutton and changing an output state.

Due to this structure, the permanent magnet of the pushbutton and the Hall element integrated circuit corresponding thereto structure contactless switches respectively without employing a touch panel, whereby the aforementioned problem resulting from the touch panel can be solved while making the best use of such characteristics that thinning is possible and a stroke feeling as well as a click feeling can be obtained. At this point, the stroke feeling means a sense of pushing, and the click feeling is such a sense that pushing abruptly lightens halfway.

In other words, no touch panel lowering visibility intervenes between the pushbutton and the display panel located under the same dissimilarly to the aforementioned prior art, whereby visibility of the display contents of the display panel improves. Further, the pushbutton can be approached to the lower display panel due to the absence of the touch panel so that parallax in the case of obliquely viewing the display panel lessens, whereby visibility of the display contents of the display panel improves as compared with the case of employing a touch panel also from this point of view.

Further, the Hall element integrated circuit is structured by a semiconductor element, completely of a static type and has no mechanically moving part such as a transparent thin plate of a touch panel, whereby the ranges of the operating temperature and the storage temperature thereof are wide as compared with the touch panel and hence environmental resistance improves as compared with the case of employing the touch panel.

In addition, a non-contact detection system by combination of the Hall element integrated circuit and the permanent magnet is employed, whereby there is no deteriorating part and hence the life lengthens as compared with the case of employing the touch panel. Reliability of the switch also rises.

Further, the Hall element integrated circuit is provided in correspondence to one or more pushbuttons, whereby which pushbuttons are pressed individually or simultaneously can be reliably determined.

In this thin switch, further, the permanent magnet provided on the pushbutton serves both as the permanent magnet for the return means and the permanent magnet for changing the output state of the Hall element integrated circuit, whereby no extra permanent magnet may be provided exclusively for the Hall element integrated circuit. Therefore, reduction of the number of components, reduction of the number of assembling steps, miniaturization/weight reduction and reduction of the cost can be thereby attained.

BRIEF DESCRIPTION OF THE DRAWINGS

FIG. 5(A) shows a state not pressing the pushbutton, and FIG. 5(B) shows a state pressing the pushbutton.

FIG. 6(A) shows a state not pressing the pushbutton, and FIG. 6(B) shows a state pressing the pushbutton.

FIG. 7(A) shows a state not pressing the pushbutton, and FIG. 7(B) shows a state pressing the pushbutton.

FIG. 8(A) shows a state not pressing the pushbutton, and FIG. 8(B) shows a state pressing the pushbutton.

FIG. 9(A) shows a state not pressing the pushbutton, and FIG. 9(B) shows a state pressing the pushbutton.

FIG. 10(A) shows a state not pressing the pushbutton, and FIG. 10(B) shows a state pressing the pushbutton.

FIG. 11(A) shows a state not pressing the pushbutton, and FIG. 11(B) shows a state pressing the pushbutton.

FIG. 12(A) shows a state not pressing the pushbutton, and FIG. 12(B) shows a state pressing the pushbutton.

FIG. 13(A) shows a state not pressing the pushbutton, and FIG. 13(B) shows a state pressing the pushbutton.

FIG. 14(A) shows a state not pressing the pushbutton, and FIG. 14(B) shows a state pressing the pushbutton.

FIG. 15(A) shows a state not pressing the pushbutton, and FIG. 15(B) shows a state pressing the pushbutton.

DETAILED DESCRIPTION OF THE INVENTION

Figure 1:
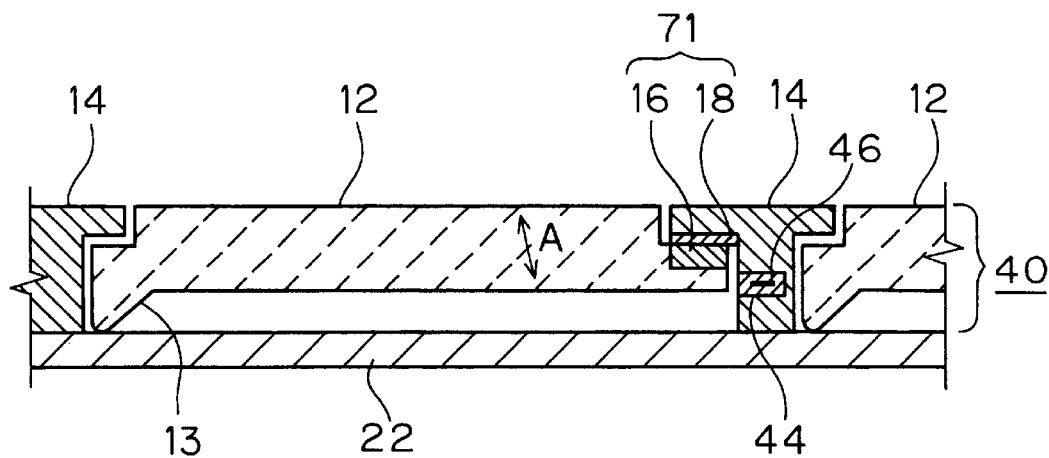
FIG. 1 is a sectional view partially showing an embodiment of a display panel provided with a switch employing a thin switch whose pushbutton is of a rotary system.

A display panel provided with a switch according to an embodiment of the present invention employs a thin switch whose pushbutton is of a rotary system as shown in FIG. 1, and has a structure obtained by superposing a thin switch 40 on a display panel 22 having an information display function.

This display panel provided with a switch has the structure obtained by superposing the thin switch 40 according to the present invention on the display panel 22 having an information display function.

The display panel 22, which is typically a liquid crystal display having a backlight, may have no backlight. The display panel 22 may alternatively be an EL (electroluminescent) display, a plasma display, a thin CRT, an LED array, or further that obtained by combining a memorizable plate or a liquid crystal shutter displaying information and an emitter or a reflector illuminating the same or the like, and the point is that the same may have an information display function.

In this example, the thin switch 40 has at least one pushbutton 12 (a plurality of pushbuttons 12 here) arranged on the aforementioned display panel 22 and rotatable about a fulcrum projection 13 provided on a lower surface part in a press direction at a constant stroke as shown by arrow A in FIG. 1. Each pushbutton 12, transparent in this example, may not necessarily be transparent but may be translucent depending on display contents of the display panel 22 or the like, and the point is that the same may transmit light from the lower display panel 22. This pushbutton 12 consists of a nonmagnetic body, not to disturb a magnetic field by its permanent magnet 16. This also applies to subsequently described bridges 14.

The bridges 14 are arranged in the vicinity of outer sides of two opposite edges (sides) of each pushbutton 12, more concretely the edge on the aforementioned fulcrum projection 13 side and on the permanent magnet 16 side opposed thereto in this example. These bridges 14 can also be referred to as supports. In this example, upper portions of these bridges 14 project on end portions (the aforementioned two edges) of each pushbutton 12, for engaging with the end portions of each pushbutton 12 and preventing each pushbutton 12 from displacement.

Figure 5:
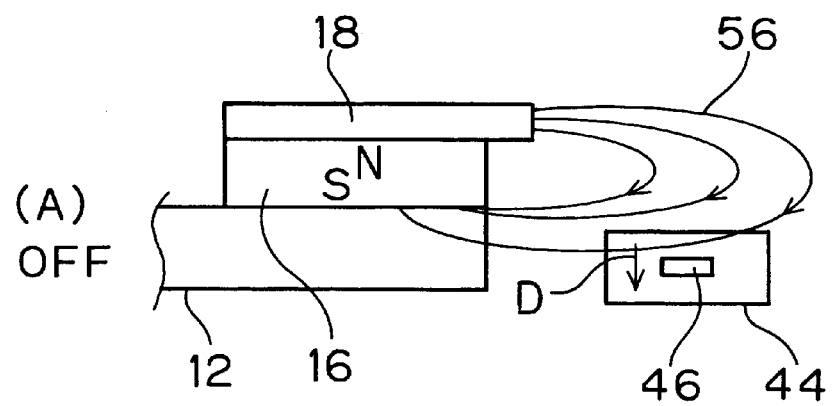
FIG. 5(A) and FIG. 5(B) are diagrams showing exemplary positional relation with a permanent magnet of the pushbutton at the time of transversely setting the Hall element integrated circuit and states of magnetic fluxes from this permanent magnet.
Figure 5:
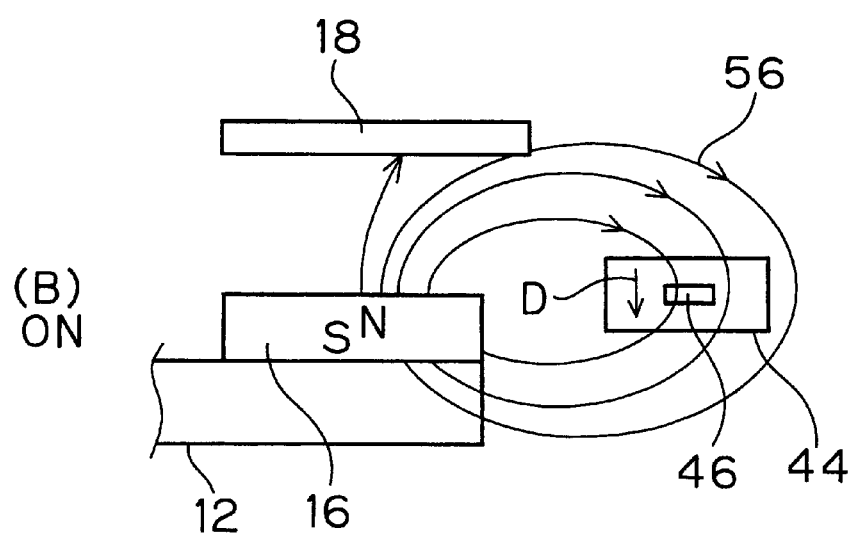

In this example, the permanent magnet 16 is provided on one end portion (one side portion) of each pushbutton 12 facing the bridge 14. In other words, the fulcrum projection 13 is provided on a lower portion of an end portion of each pushbutton 12 on the side facing one (left in FIG. 1) bridge 14, and the permanent magnet 16 is provided on an upper portion of an end portion facing the other (right in FIG. 1) bridge 14 on the opposite side thereof in this example. Magnetic pole arrangement of this permanent magnet 16 is described later with reference to drawings subsequent to FIG. 5(A) and FIG. 5(B).

On an upper portion of the bridge 14 opposed to the permanent magnet 16 of each pushbutton 12, a plate-shaped magnetic body 18 attracted by the permanent magnet 16 is provided in this example respectively. The magnetic body 18 is more concretely a ferromagnetic body such as an iron plate, for example. This also applies to a magnetic body 58 described later. In place of this magnetic body 18, a permanent magnet 60 (see FIG. 14(A), FIG. 14(B), FIG. 15(A) and FIG. 15(B)) mutually attracting with the permanent magnet 16 may be provided.

The permanent magnet 16 of each pushbutton 12 and the aforementioned magnetic body 18 (or the permanent magnet 60) opposed thereto structure return means 71 (see FIG. 1) for generating returning force in each pushbutton 12 by attractive force generated therebetween while causing a click feeling when pressing each pushbutton 12. In other words, the permanent magnet 16 of each pushbutton 12 and the magnetic body 18 or the permanent magnet 60 opposed thereto act in association with each other, for generating return force by attractive magnetic force in each pushbutton 12 while causing a click feeling when pressing each pushbutton 12.

The click feeling takes place for the following reason: That is, the permanent magnet 16 strongly attracts the magnetic body 18 first and hence the pushbutton 12 does not rotate unless the pushbutton 12 is pressed strongly to some extent, while the distance between the permanent magnet 16 and the magnetic body 18 enlarges and the force of the permanent magnet 16 attracting the magnetic body 18 abruptly weakens when the pushbutton 12 slightly rotates. Therefore, pushdown abruptly lightens following rotation of the pushbutton 12, thereby causing a click feeling. This also applies to the case of providing the permanent magnet 60 in place of the magnetic body 18.

A Hall element integrated circuit (the so-called Hall IC) 44 is provided on the bridge 14 of the side facing (opposed to) the permanent magnet 16 of each pushbutton 12 as to each pushbutton 12 respectively. This Hall element integrated circuit 44 is embedded in the bridge 14, for example.

This Hall element integrated circuit 44 has a Hall element 46 and a determination circuit 47 determining whether or not its Hall voltage is larger than a threshold. When the corresponding pushbutton 12 is pressed, each Hall element integrated circuit 44 detects change of the magnetic field by the permanent magnet 16 of this pushbutton 12 and changes an output state. For example, the output voltage is changed from a low level (in other words, a state of a logical value 0. This is hereinafter referred to as an OFF state) to a high level (in other words, a state of a logical value 1. This is hereinafter referred to as an ON state) or vice versa. More concretely, the Hall element integrated circuit 44 enters an ON state when a magnetic field of at least constant strength is substantially vertically applied to its Hall element 46 from a decided single direction. Drawings subsequent to FIG. 5(A) and FIG. 5(B) show field directions (ON-field directions) bringing this ON state with arrows D.

Figure 6:
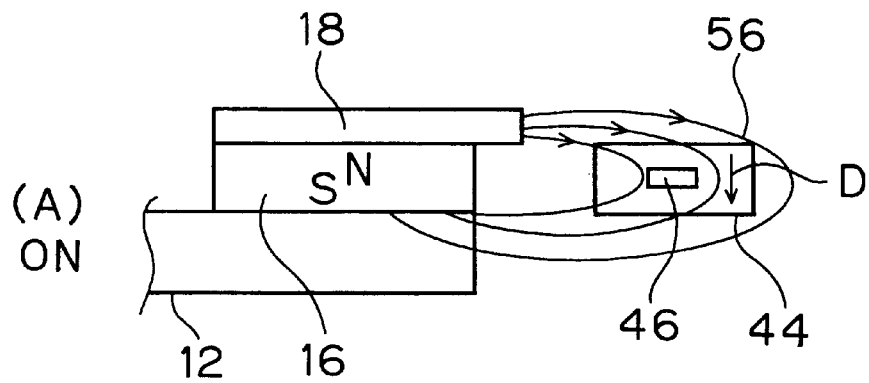
FIG. 6(A) and FIG. 6(B) are diagrams showing another exemplary positional relation with the permanent magnet of the pushbutton at the time of transversely setting the Hall element integrated circuit and states of magnetic fluxes from this permanent magnet.
Figure 6:
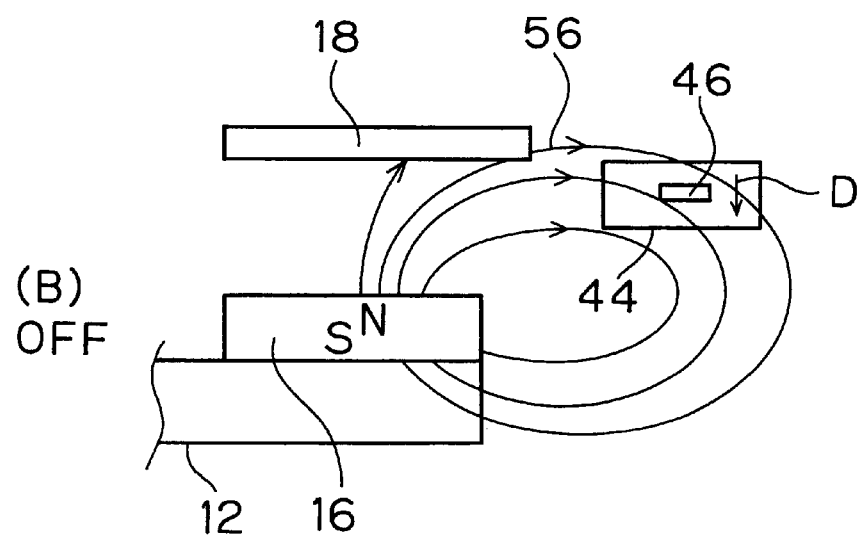
Figure 7:
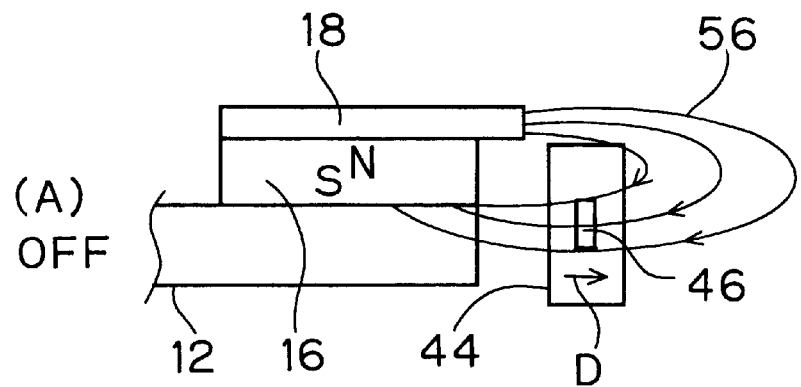
FIG. 7(A) and FIG. 7(B) are diagrams showing exemplary positional relation with the permanent magnet of the pushbutton at the time of vertically setting the Hall element integrated circuit and states of magnetic fluxes from this permanent magnet.
Figure 7:
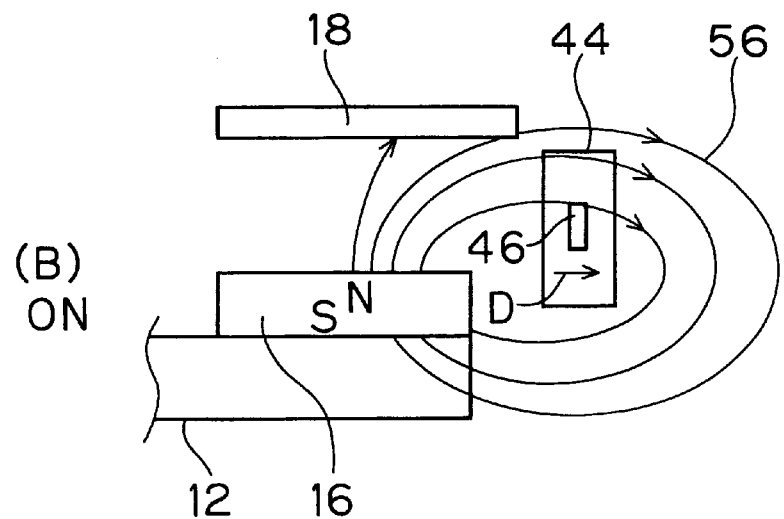
Figure 8:
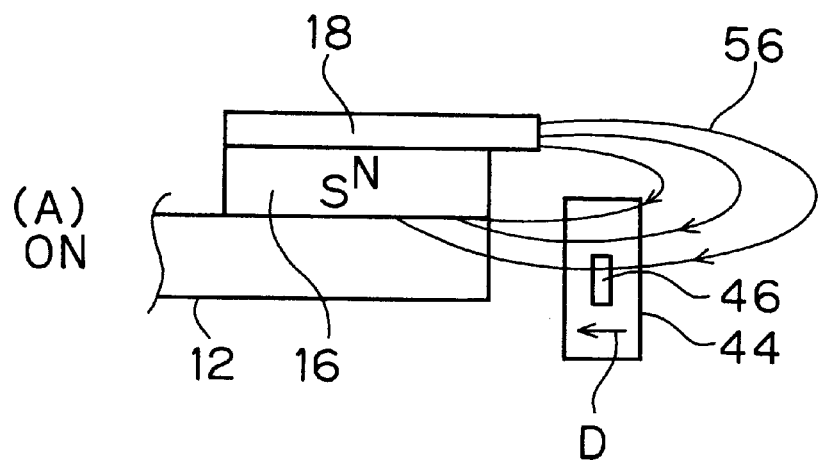
FIG. 8(A) and FIG. 8(B) are diagrams showing another exemplary positional relation with the permanent magnet of the pushbutton at the time of vertically setting the Hall element integrated circuit and states of magnetic fluxes from this permanent magnet.
Figure 8:
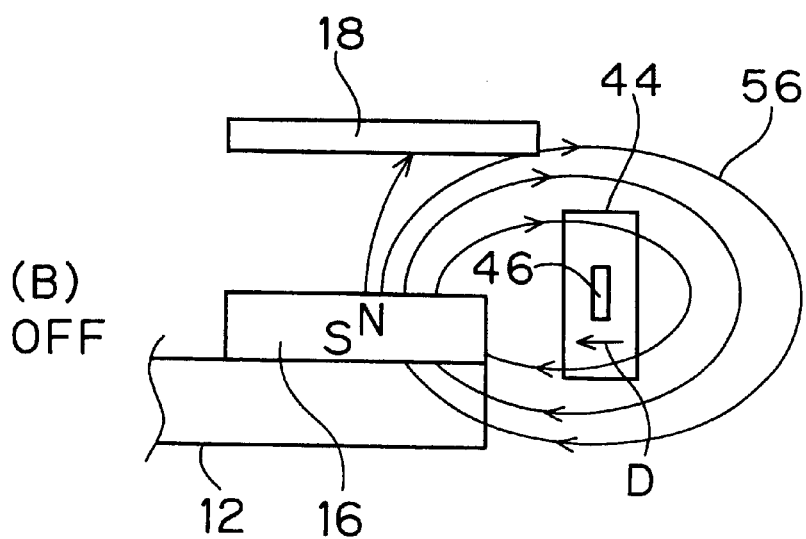
Figure 9:
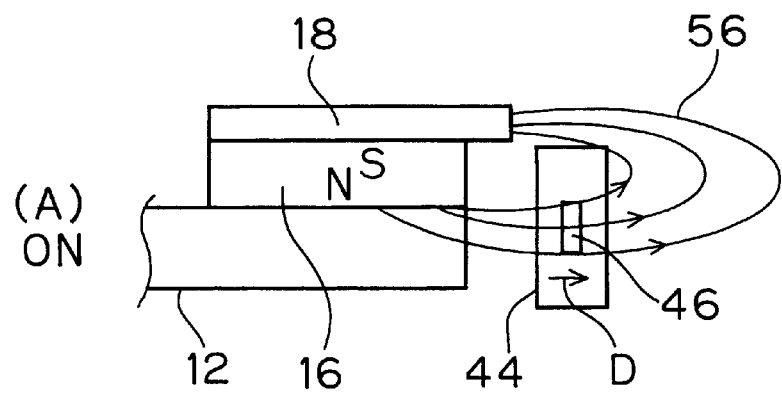
FIG. 9(A) and FIG. 9(B) are diagrams showing an example reversing the polarity of the permanent magnet of the pushbutton from the case of FIG. 7(A) and FIG. 7(B)
Figure 9:
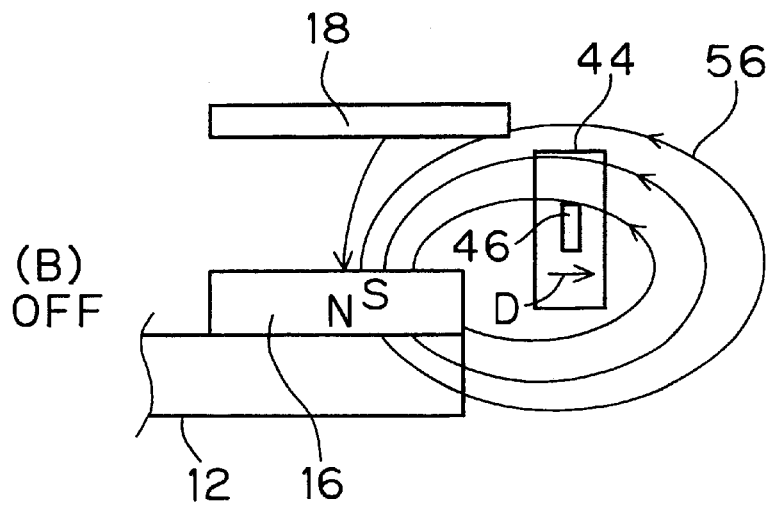
Figure 10:
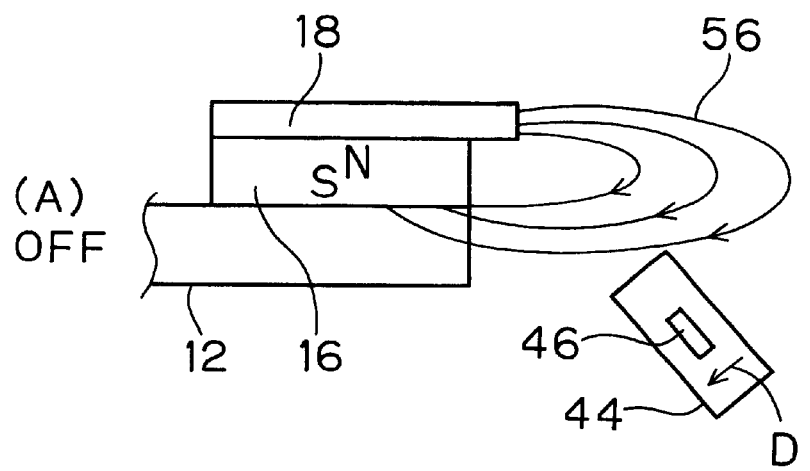
FIG. 10(A) and FIG. 10(B) are diagrams showing an example obliquely setting the Hall element integrated circuit.
Figure 10:
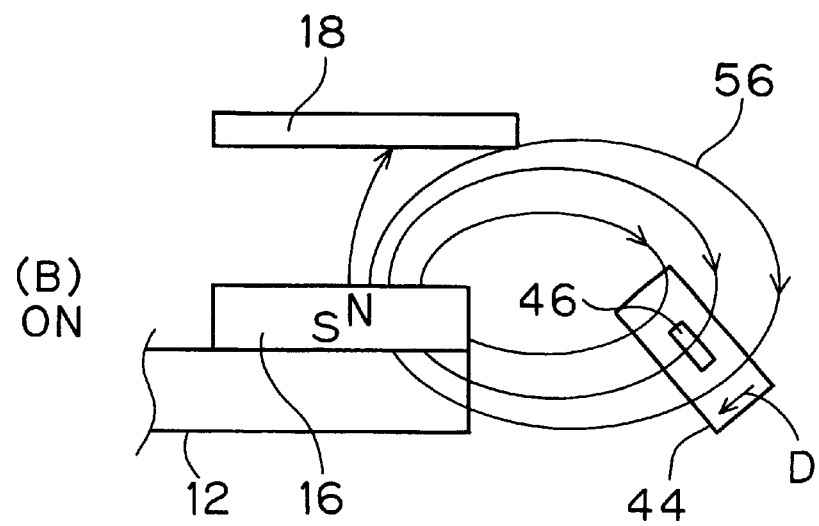
Figure 11:
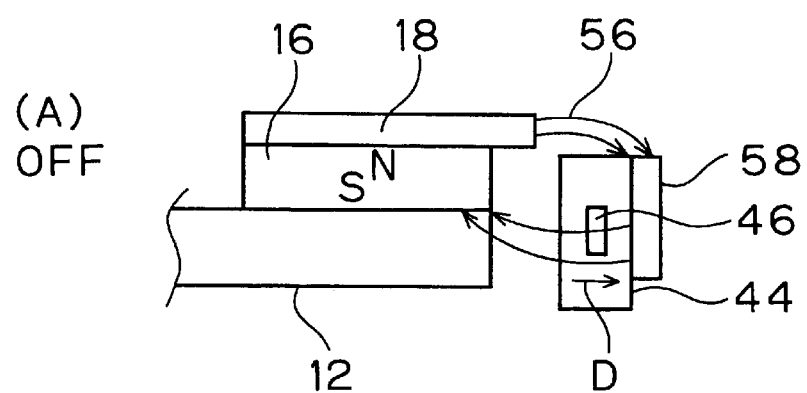
FIG. 11(A) and FIG. 11(B) are diagrams showing an example obtained by providing a magnetic body on the back surface of the Hall element integrated circuit.
Figure 11:
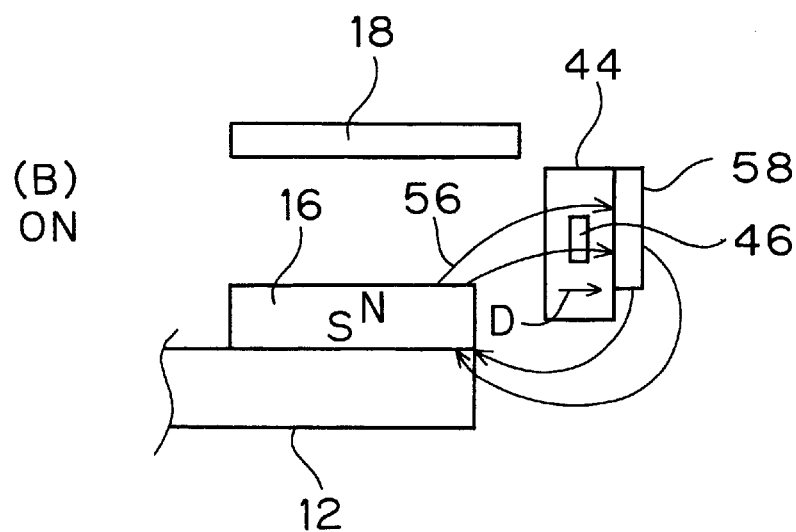
Figure 12:
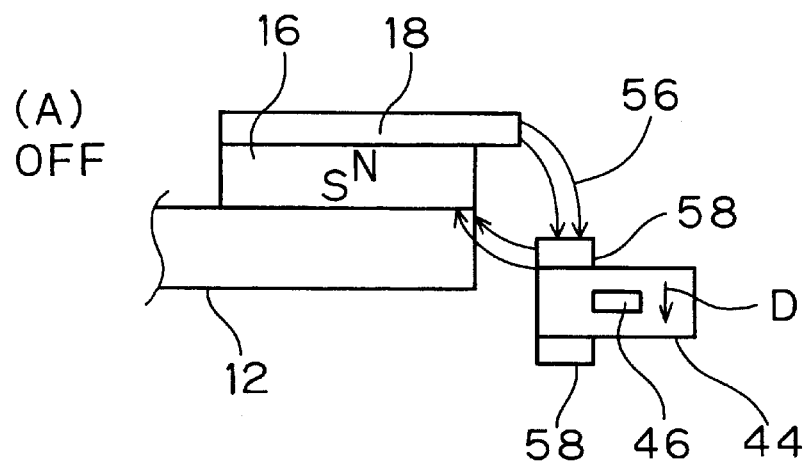
FIG. 12(A) and FIG. 12(B) are diagrams showing an example obtained by providing magnetic bodies on upper and lower portions of the Hall element integrated circuit.
Figure 12:
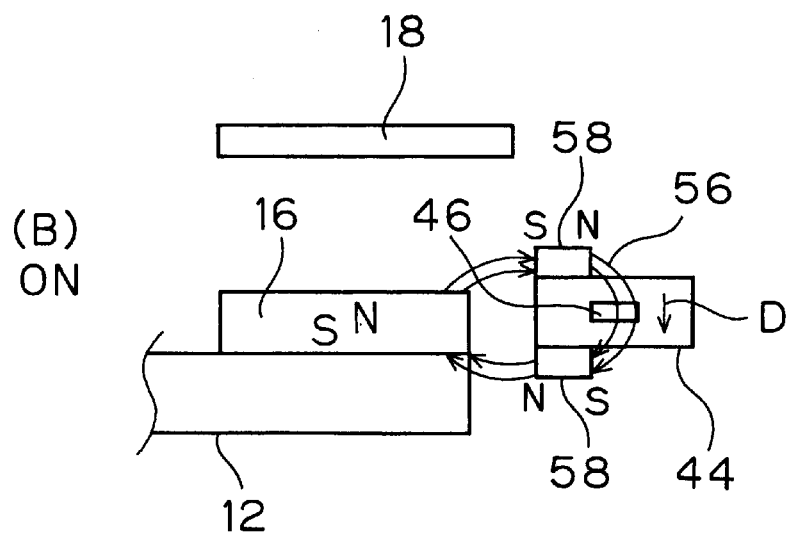
Figure 13:
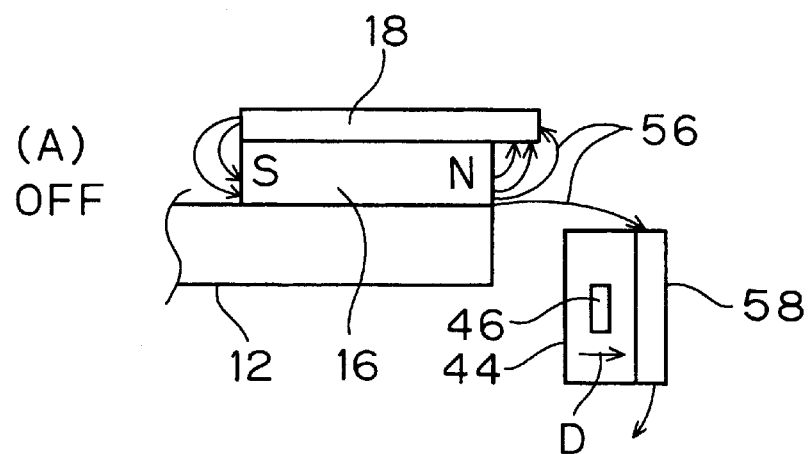
FIG. 13(A) and FIG. 13(B) are diagrams showing an example obtained by horizontally arranging magnetic poles of the permanent magnet of the pushbutton.
Figure 13:
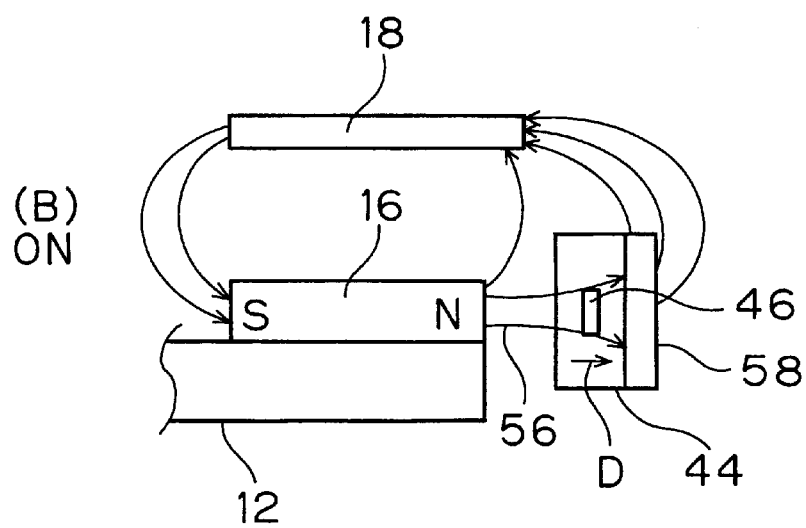
Figure 14:
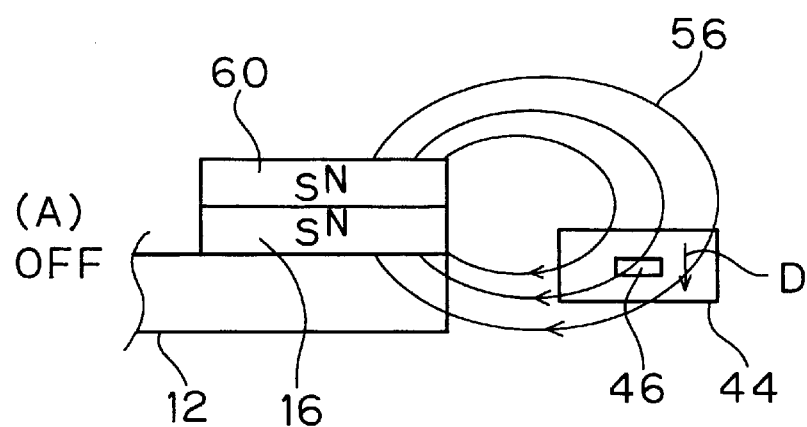
FIG. 14(A) and FIG. 14(B) are diagrams showing an example obtained by providing a permanent magnet also on the side of a bridge.
Figure 14:
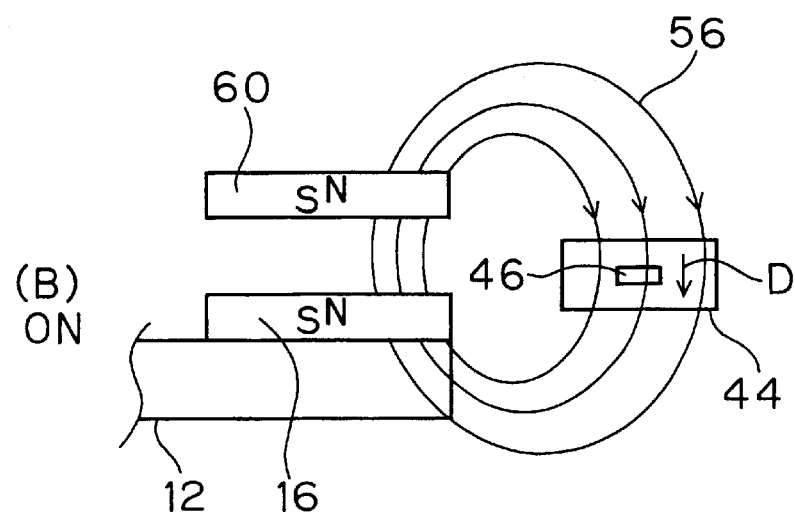
Figure 15:
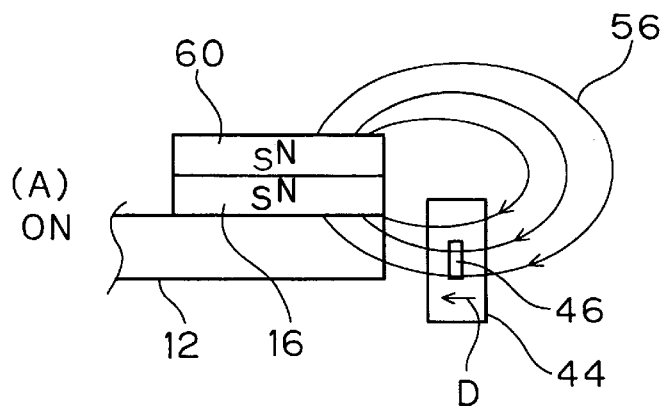
FIG. 15(A) and FIG. 15(B) are diagrams showing another example obtained by providing a permanent magnet also on the side of the bridge.
Figure 15:
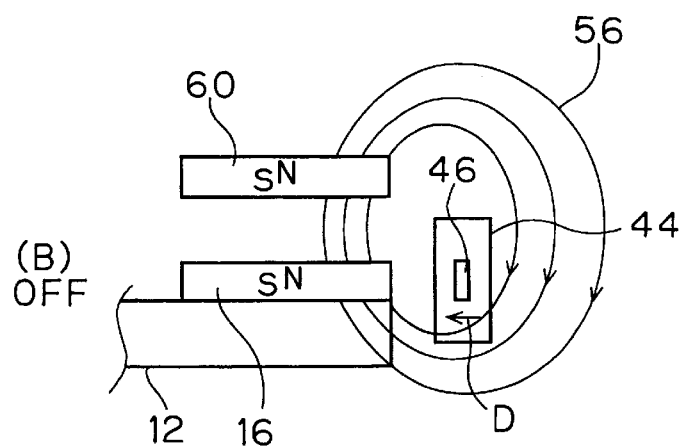

More concrete positional relation between this Hall element integrated circuit 44 and the permanent magnet 16 is described later with reference to drawings subsequent to FIG. 5(A) and FIG. 5(B). For example, an example shown in FIG. 5(A) and FIG. 5(B) is such an example that the Hall element integrated circuit 44 enters an ON state when pressing the pushbutton 12, and an example shown in FIG. 6(A) an FIG. 6(B) is such an example that the Hall element integrated circuit 44 enters an OFF state when pressing the pushbutton 12.

Figure 4:
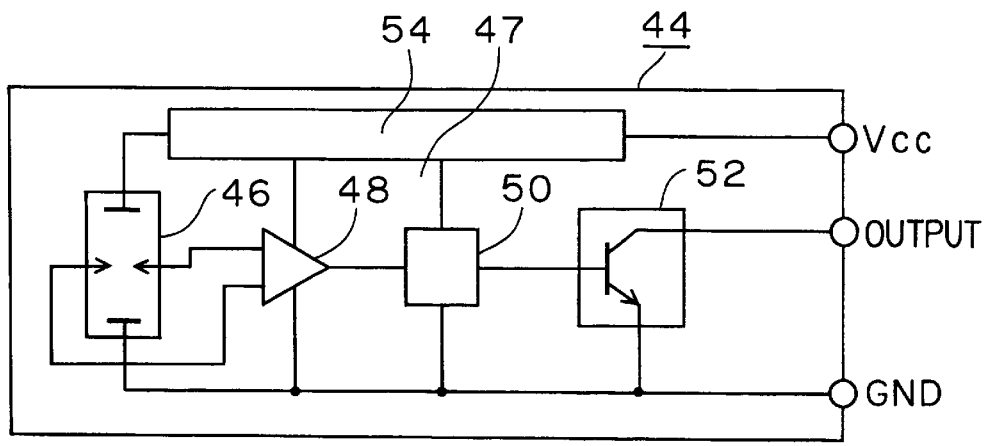
FIG. 4 is a circuit diagram showing an exemplary structure of a Hall element integrated circuit.

FIG. 4 shows an exemplary structure of the Hall element integrated circuit 44. This Hall element integrated circuit 44 comprises the Hall element 46, an amplifier 48, a Schmidt trigger circuit 50, an output stage circuit 52 and a power supply-compensation circuit 54, which is obtained by integrating these with each other and storing the same in one package. This amplifier 48, the Schmidt trigger circuit 50 and the output stage circuit 52 structure the aforementioned determination circuit 47 in this example.

The Hall element 46 senses the magnetic field and generates Hall voltage. The amplifier 48 amplifies 48 amplifies the Hall voltage of this Hall element 46. The Schmidt trigger circuit 50 compares the voltage from the amplifier 48 with constant threshold voltage and outputs voltage of a low level or a high level. The output stage circuit 52 amplifies and outputs the voltage from the Schmidt trigger circuit 50. The power supply-compensation circuit 54 performs power supply voltage stabilization and temperature compensation.

Figure 2:
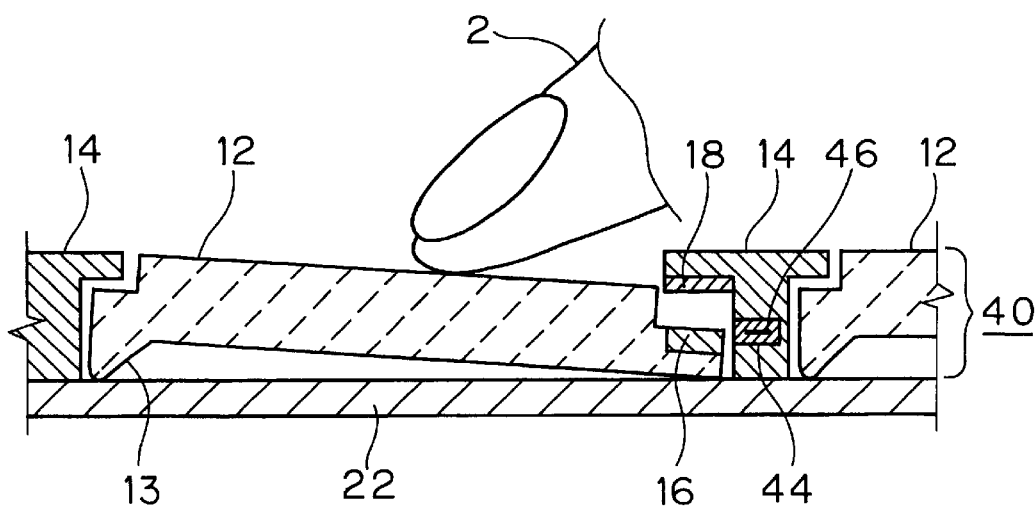
FIG. 2 is a diagram showing a state pressing the pushbutton of the display panel provided with a switch shown in FIG. 1.

According to this thin switch 40, the pushbutton 12 rotates at a constant stroke until the lower end of this pushbutton 12 on the permanent magnet 16 side comes into contact with the lower display panel 22 when an arbitrary pushbutton 12 thereof is pressed with a finger 2 or the like, as shown in FIG. 2. Following this rotation, the positional relation between the permanent magnet 16 and the Hall element integrated circuit 44 corresponding to this pushbutton 12 changes so that the Hall element integrated circuit 44 detects change of the magnetic field by the permanent magnet 16 and changes the output state from an OFF state to an ON state, for example, or vice versa. Therefore, it is possible to detect that the pushbutton 12 is pressed on the basis of this change of the output state of the Hall element integrated circuit 44.

When stopping pressing the pushbutton 12, the pushbutton 12 returns to the original state due to returning force (i.e., the force of the permanent magnet 16 attracting the magnetic body 18) of the said return means. Following this, the output state of the Hall element integrated circuit 44 also returns to the original state.

Thus, this thin switch 40 structures a contactless switch by the permanent magnet 16 of each pushbutton 12 and the Hall element integrated circuit 44 corresponding thereto respectively and employs no touch panel, whereby the aforementioned problem resulting from the touch panel can be solved.

That is, no touch panel lowering visibility intervenes between the pushbutton 12 and the display panel 22 located under the same dissimilarly to the prior art, whereby visibility of the display contents of the display panel 22 improves. Further, the pushbutton 12 can be approached to the lower display panel 22 due to the absence of the touch panel so that parallax in the case of obliquely viewing the display panel 22 lessens, whereby visibility of the display contents of the display panel 22 improves as compared with the case of employing a touch panel also from this point of view.

Further, the Hall element integrated circuit 44 is structured by a semiconductor element, is completely of a static type and has no mechanically moving part such as a transparent thin plate of a touch panel, whereby the ranges of the operating temperature and the storage temperature thereof are wide as compared with the touch panel. For example, the operating temperature is about −40° to 100° C. and the storage temperature is about −55° C. to 125° C., i.e., remarkably wide. Therefore, environmental resistance improves as compared with the case of employing a touch panel.

In addition, a contactless detection system (in other words, a non-contact switch) by the combination of the Hall element integrated circuit 44 and the permanent magnet 16, whereby there is no deteriorating part and hence the life lengthens as compared with the case of employing a touch panel. Reliability of the switch also rises.

Further, the Hall element integrated circuit 44 is provided in one-to-one correspondence to each pushbutton 12, whereby which pushbuttons 12 are pressed can be reliably determined also when a plurality of pushbuttons 12 are simultaneously pressed.

According to this thin switch 40, in addition, thinning is possible and a stroke feeling as well as a click feeling can be obtained.

That is, this thin switch 40, provided with the Hall element integrated circuit 44 by far miniaturizable than a contact switch by embedding the same in the bridge 14 or the like, does not require a large thickness and hence can be thinned. Further, no touch panel is employed, whereby the same can be further thinned as compared with the case of employing a touch panel.

Further, it has the pushbutton 12 movable in the press direction at a constant stroke, whereby a stroke feeling can be obtained. In addition, the permanent magnet 16 of the pushbutton 12 and the magnetic body 18 or the permanent magnet 60 on the bridge 14 side structure the return means 71 generating returning force by attractive magnetic force on the pushbutton 12 and causing a click feeling when pressing the pushbutton 12, whereby a click feeling can also be obtained. Thus, the operational feeling of the switch improves, and the switch operation becomes reliable.

In this thin switch 40, further, the permanent magnet 16 provided on each pushbutton 12 serves both as the permanent magnet for the aforementioned return means and the permanent magnet for changing the output state of the Hall element integrated circuit 44, whereby no extra permanent magnet may be provided exclusively for the Hall element integrated circuit 44. Although it is generally necessary to specifically provide a dedicated permanent magnet when employing a Hall element integrated circuit, this thin switch 40 has no such requirement. Therefore, reduction of the number of components, reduction of the number of assembling steps, miniaturization/weight reduction and reduction of the cost can be attained.

While an idea of providing a reed switch in place of the Hall element integrated circuit 44 is conceivable, it is not preferable. This is because the reed switch is a switch having a contact, which is by far inferior in reliability of a switching operation and life as compared with the case of employing the Hall element integrated circuit 44. Once the reed switch is turned on and contacts adsorb each other, magnetic resistance between the contacts abruptly lowers and hence the contacts cannot be separated and turned off unless remarkably separating the permanent magnet 16 from the reed switch, the stroke (the quantity of displacement) of the pushbutton 12 must be enlarged therefor, and the thickness of the thin switch 40 thereby enlarges to inhibit thinning.

Examples of the positional relation between the permanent magnet 16 of the aforementioned pushbutton 12 and the Hall element integrated circuit 44 on the bridge 44 side are now described with reference to FIG. 5(A) to FIG. 15(B). Each figure shows principal ones of magnetic fluxes 56 going into and out from the permanent magnet 16. Arrow D in each figure shows the aforementioned ON-field direction where the Hall element integrated circuit 44 enters an ON state. In these figures, the bridges 14 are unnecessary for description and hence illustration thereof is omitted.

The example shown in FIG. 5(A) and FIG. 5(B) shows the portion around the Hall element integrated circuit 44 of the example shown in FIG. 1 in an enlarged manner. In this example, magnetic poles of the permanent magnet 16 are vertically arranged as NS while the Hall element integrated circuit 44 is transversely set (in other words, arranging the Hall element integrated circuit 44 substantially in parallel with the permanent magnet 16) on a relatively low portion. In the state not pressing the pushbutton 12 shown in FIG. 5(A), the magnetic fluxes 56 transversely pass through the Hall element 46 with respect to the ON-field direction D, and the Hall element integrated circuit 44 is in an OFF state. In the state pressing the pushbutton 12 shown in FIG. 5(B), the magnetic fluxes 56 pass through the Hall element along the ON-field direction (D) (that is, in the same direction as the ON-field direction D and substantially in parallel with this ON-field direction D. This also applies to the following), and the Hall element integrated circuit 44 is in an ON state.

The example shown in FIG. 6(A) and FIG. 6(B) is an example transversely setting the Hall element integrated circuit 44 on a relatively upper portion. In the state not pressing the pushbutton shown in FIG. 6(A), the magnetic fluxes 56 pass through the Hall element 46 along the ON-field direction D, and the Hall element integrated circuit 44 is in an ON state. In the state pressing the pushbutton 12 shown in FIG. 6(B), the magnetic fluxes 56 obliquely pass through the Hall element 46 with respect to the ON-field direction D, and the Hall element integrated circuit 44 is in an OFF state.

The example shown in FIG. 7(A) and FIG. 7(B) is an example vertically setting the Hall element integrated circuit 44 (in other words, substantially rectangularly arranging the Hall element integrated circuit 44 with respect to the permanent magnet 16) on a relatively upper portion. In the state not pressing the pushbutton 12 shown in FIG. 7(A), the magnetic fluxes 56 pass through the Hall element 46 oppositely to the ON-field direction D, and the Hall element integrated circuit 44 is in an OFF state. In the state pressing the pushbutton 12 shown in FIG. 7(B), the magnetic fluxes 56 pass through the Hall element 46 along the ON-field direction D, and the Hall element integrated circuit 44 is in an ON state.

The example shown in FIG. 8(A) and FIG. 8(B) is an example vertically setting the Hall element integrated circuit 44 on an intermediate or relatively lower portion, and reverses the ON-field direction D of the Hall element integrated circuit 44 from that of FIG. 7(A) and FIG. 7(B). In the state not pressing the pushbutton 12 shown in FIG. 8(A), the magnetic fluxes 56 pass through the Hall element 46 along the ON-field direction D, and the Hall element integrated circuit 44 is in an ON state. In the state pressing the pushbutton 12 shown in FIG. 8(B), a magnetic field is hardly applied to the Hall element 46 and the Hall element integrated circuit 44 is in an OFF state.

In each of the examples of the aforementioned FIG. 5(A) and FIG. 5(B) to FIG. 8(A) and FIG. 8(B) and other respective examples described later, the magnetic poles of the permanent magnet 16 may be reversed from the illustrated example. In this case, the ON-field direction D of the Hall element integrated circuit 44 may also be reversed from the illustrated example. Thus, ON/OFF states similar to each of the illustrated examples can be attained. When reversing the polarity of the permanent magnets 16, the polarity of the permanent magnets 60 on the bridge 14 sides may also be reversed in the examples shown in FIG. 14(A) and FIG. 14(B) and FIG. 15(A) and FIG. 15(B) described later.

As in the example shown in FIG. 9(A) and FIG. 9(B), however, only the polarity of the permanent magnet 16 may be reversed from the example shown in FIG. 7(A) and FIG. 7(B). In this example of FIG. 9(A) and FIG. 9(B), the magnetic fluxes 56 pass through the Hall element 46 along the ON-field direction D and the Hall element integrated circuit 44 is in an ON state in the state not pressing the pushbutton 12 shown in FIG. 9(A). In the state pressing the pushbutton 12 shown in FIG. 9(B), the magnetic fluxes 56 pass through the all element 46 oppositely to the ON-field direction D, and the Hall element integrated circuit 44 is in an OFF state.

Thus, in the examples of FIG. 7(A) and FIG. 7(B) and FIG. 9(A) and FIG. 9(B), ON cases and OFF cases can be readily switched when pressing the pushbuttons 12 by merely reversing the polarity arrangement of the permanent magnets 16, i.e., by merely vertically reversing and arranging the permanent magnets 16.

Comparing transverse setting and vertical setting of the Hall element integrated circuit 44, the dimension in the vertical direction (thickness direction) may be small and hence the thin switch 40 can be further thinned when transversely setting the Hall element integrated circuit 44. Further, the pushbutton 12 can thus be further approached to the display panel 22, whereby visibility of the display contents of the display panel 22 further improves.

Figure 3:
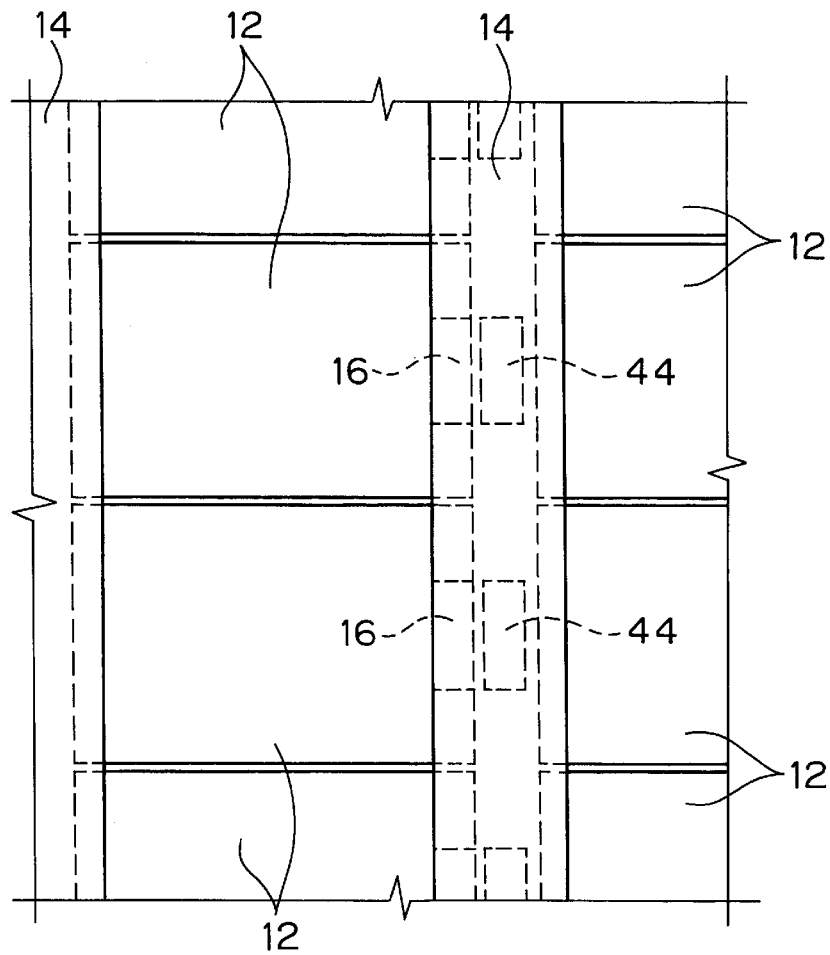
FIG. 3 is a schematic plan view showing exemplary plane arrangement of the display panel provided with a switch shown in FIG. 1.

Further, when arranging a plurality of pushbuttons 12 along the bridges 14 as in the example shown in FIG. 3, for example, a plurality of Hall element integrated circuits 44 can be simultaneously arranged by mounting a substance obtained by arranging and mounting the plurality of Hall element integrated circuits 44 on a flexible substrate at prescribed intervals, for example, on the bridges 14 when transversely setting the Hall element integrated circuits 44, whereby productivity improves as compared with the case of vertical setting.

However, the Hall element integrated circuit 44 may be obliquely arranged, as in the example shown in FIG. 10(A) and FIG. 10(B), for example. The point is that the Hall element integrated circuit 44 may be arranged in such a state that a case where the magnetic fluxes 56 pass along the ON-field direction D and no such case are switched when pressing and not pressing the pushbutton 12. In this example of FIG. 10(A) and FIG. 10(B), the magnetic fluxes 56 obliquely pass through the Hall element 46 with respect to the ON-field direction D and the Hall element integrated circuit 44 is in an OFF state in the state not pressing the pushbutton 12 shown in FIG. 10(A). In the state pressing the pushbutton 12 shown in FIG. 10(B), the magnetic fluxes 56 pass through the Hall element 46 along the ON-field direction D, and the Hall element integrated circuit 44 is in an ON state.

A magnetic body may be closely arranged on the back surface of the aforementioned Hall element integrated circuit 44, or magnetic bodies may be closely arranged on upper and lower portions of the Hall element integrated circuit 44. Thus, the magnetic fluxes 56 from the permanent magnet 16 of the pushbutton 12 are strongly guided to the magnetic body, whereby it also becomes possible to more clearly turn on/off the Hall element integrated circuit 44 by more clearly distinguishing whether or not to apply a magnetic field in the ON-field direction D of the Hall element integrated circuit 44 when pressing and not pressing the pushbutton 12.

For example, FIG. 11(A) and FIG. 11(B) show an example providing a magnetic body 58 on the back surface of the Hall element integrated circuit 44 of the example shown in FIG. 7(A) and FIG. 7(B) In this example, the magnetic fluxes 56 pass through the Hall element 46 oppositely to the ON-field direction D and the Hall element integrated circuit 44 is in an OFF state in the state not pressing the pushbutton 12 shown in FIG. 11(A) In the state pressing the pushbutton 12 shown in FIG. 11(B), the magnetic fluxes 56 pass through the Hall element 46 along the ON-field direction D, and the Hall element integrated circuit 44 is in an ON state. Thus, the direction of the magnetic field applied to the Hall element integrated circuit 44 can be completely reversed.

The example shown in FIG. 12(A) and FIG. 12(B) is like that holding upper and lower portions around inner ends of the Hall element integrated circuit 44 of the example shown in FIG. 5(A) and FIG. 5(B) with magnetic bodies 58. In this example, a magnetic field is hardly applied to the Hall element 46 and the Hall element integrated circuit 44 is in an OFF state in the state not pressing the pushbutton 12 shown in FIG. 12(A). In the state pressing the pushbutton 12 shown in FIG. 12(B), the magnetic fluxes 56 pass through the Hall element 46 along the ON-field direction D, and the Hall element integrated circuit 44 is in an ON state. Thus, the magnetic field applied to the Hall element integrated circuit 44 can be rendered intermittent. The magnetic poles S and N of the magnetic bodies 58 are those by magnetic induction from the permanent magnet 16.

The magnetic poles of the permanent magnet 16 of the pushbutton 12 may be horizontally arranged. However, there is such an advantage that a large number of permanent magnets 16 can be readily simultaneously produced when vertically arranging the same. FIG. 13(A) and FIG. 13(B) show an example horizontally arranging the magnetic poles S and N of the permanent magnet 16. In this example, a magnetic body 58 is further provided on the back surface of the vertically set Hall element integrated circuit 44. In this example, a magnetic field is hardly applied to the Hall element 46 and the Hall element integrated circuit 44 is in an OFF state in the state not pressing the pushbutton 12 shown in FIG. 13(A). In the state pressing the pushbutton 12 shown in FIG. 13(B), the magnetic fluxes 56 pass through the Hall element 46 along the ON-field direction D, and the Hall element integrated circuit 44 is in an ON state.

As described above, the permanent magnet 60 may be provided on the bridge 14 side in place of the aforementioned magnetic body 18, for structuring the aforementioned return means by this permanent magnet 60 and the permanent magnet 16 of the pushbutton 12. FIG. 14(A) and FIG. 14(B) and FIG. 15(A) and FIG. 15(B) show such examples respectively.

The example shown in FIG. 14(A) and FIG. 14(B) corresponds to the example shown in FIG. 5(A) and FIG. 5(B), and the magnetic fluxes 56 obliquely pass through the Hall element 46 with respect to the ON-field direction D and the Hall element integrated circuit 44 is in an OFF state in the state not pressing the pushbutton 12 shown in FIG. 14(A) in this example. In the state pressing the pushbutton 12 shown in FIG. 14(B), the magnetic fluxes 56 pass through the Hall element 46 along the ON-field direction D, and the Hall element integrated circuit 44 is in an ON state.

The example shown in FIG. 15(A) and FIG. 15(B) corresponds to the example shown in FIG. 8(A) and FIG. 8(B), and the magnetic fluxes 56 pass through the Hall element 46 along the ON-field direction D and the Hall element integrated circuit 44 is in an ON state in the state not pressing the pushbutton 12 shown in FIG. 15(A) in this example. In the state pressing the pushbutton 12 shown in FIG. 15(B), the magnetic fluxes 56 transversely pass through the Hall element 46 with respect to the ON-field direction D, and the Hall element integrated circuit 44 is in an OFF state.

Figure 16:
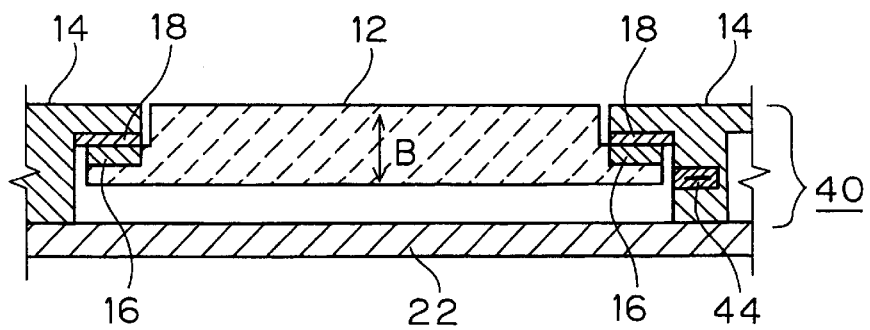
FIG. 16 is a sectional view partially showing an exemplary display panel provided with a switch employing a thin switch whose pushbutton is of a linear movement system.
Figure 17:
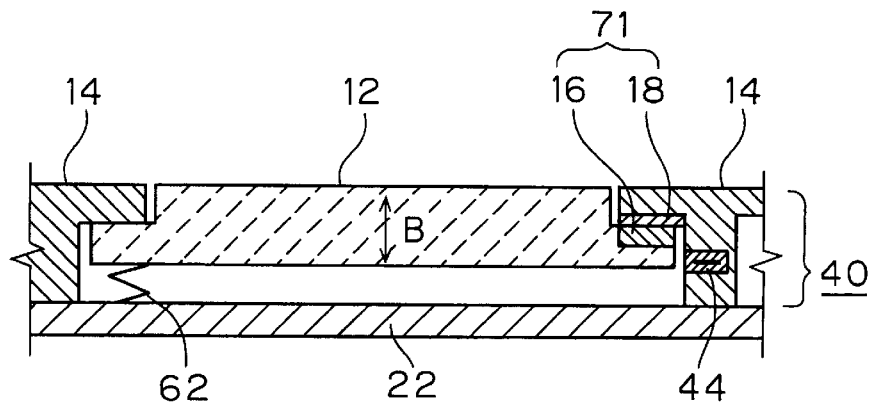
FIG. 17 is a sectional view partially showing another exemplary display panel provided with a switch employing a thin switch whose pushbutton is of a linear movement system.

Each pushbutton 12 may be rendered of a linearly retracting linear movement system in place of rendering the same of a rotation system as in each of the aforementioned examples. FIG. 16 and FIG. 17 show examples thereof respectively. Both figures correspond to the example shown in FIG. 1.

The example shown in FIG. 16 provides a permanent magnet 16 also on an end portion of the fulcrum projection in place of providing the aforementioned fulcrum projection 13 on each pushbutton 12, i.e., provides the permanent magnets 16 on two opposite end portions of the pushbutton 12, while providing the aforementioned magnetic bodies 18 on both bridges 14 facing these respective permanent magnets 16. In other words, the aforementioned return means 71 by attractive magnetic force are provided on right and left end portions of each pushbutton 12 on the sides of the bridges 14. When pressing the pushbutton 12, therefore, the pushbutton 12 linearly retracts in the press direction at a constant stroke as shown by arrow B. A click feeling also takes place when pressing. The pushbutton 12 returns when stopping pressing. The above description in the case of the rotary system is applied otherwise, and hence redundant description thereof is omitted here (this also applies to a case of FIG. 17).

In the case of this example, the Hall element integrated circuit 44 may be provided only on the side of one bridge 14 as in the illustrated example, or may be provided on both bridges 14.

In the example of FIG. 17, a spring (compression coil spring) 62 is provided under the same end portion as the fulcrum projection, i.e., under the end portion opposite to the permanent magnet 16 in place of providing the aforementioned fulcrum projection 13 on each pushbutton 12, for structuring the return means 71 on the side of this end portion by this spring 62. Also in the case of this example, the pushbutton 12 linearly retracts in the press direction at a constant stroke as shown by arrow B when pressing the pushbutton 12. A click feeling also takes place when pressing, due to the return means 71 by combination of the permanent magnet 16 and the magnetic body 18. The pushbutton 12 returns when stopping pressing.

Figure 18:
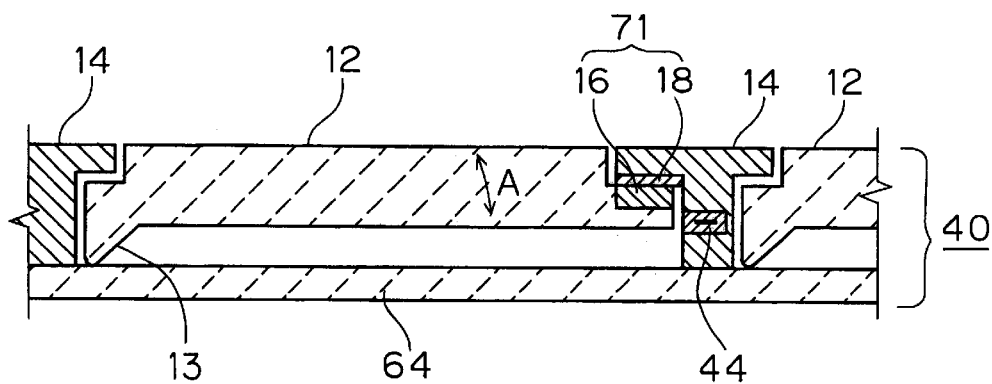
FIG. 18 is a sectional view showing an example obtained by providing a transparent or translucent support plate on the thin switch.
Figure 19:
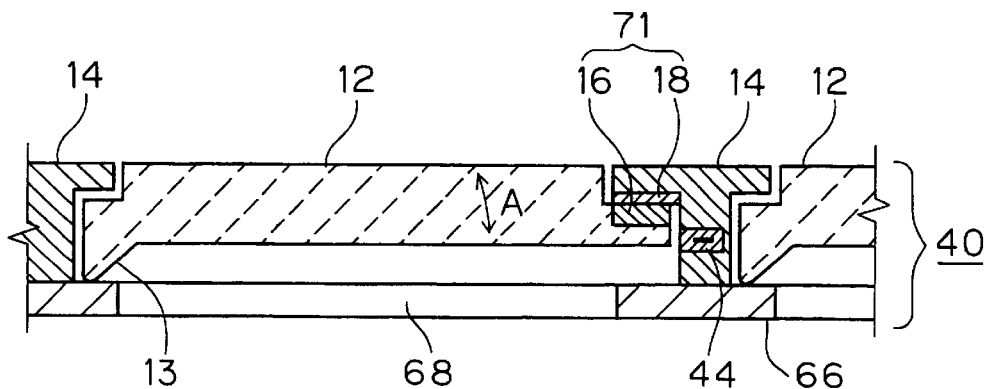
FIG. 19 is a sectional view showing an example obtained by providing a support plate having an opening on the thin switch.

While the display panel 22 serves also as a support plate (substrate) for the thin switch 40 in the display panel provided with a switch according to each of the aforementioned examples, this is not inevitably necessary. For example, a transparent or translucent support plate 64 may be provided on the thin switch 40 as in an example shown in FIG. 18. Alternatively, a support plate 66 having an opening 68 in a portion corresponding to each pushbutton 12 may be provided as in an example shown in FIG. 19. Further, the thin switches 40 of these examples may be superposed on the display panel 22, for structuring the display panel provided with a switch.

In the display panel provided with a switch according to each of the aforementioned examples, the bridges 14 may be so provided as to enclose four sides of each pushbutton 12.

While the embodiment of the present invention has been described, the scope of the present invention is not restricted to the aforementioned embodiment but defined by the attached claims.

What is claimed is:

1. A thin switch used in superposition on a display panel having an information display function, comprising:
    a pushbutton movable in a press direction at a constant stroke and transparent or translucent;
    a bridge arranged in the vicinity of outer sides of at least two opposite edges of said pushbutton;
    a first permanent magnet provided on an end of said pushbutton on the side facing said bridge;
    a magnetic body or a second permanent magnet provided on an upper portion of said bridge opposed to said first permanent magnet; and
    a Hall element integrated circuit provided on said bridge on the side facing said first permanent magnet in correspondence to said pushbutton, wherein
        said magnetic body or said second permanent magnet structures return means generating returning force in said pushbutton by attractive force generated between the same and said first permanent magnet while causing a click feeling when pressing said pushbutton along with said first permanent magnet, and
        said Hall element integrated circuit has a Hall element and a determination circuit determining whether or not its Hall voltage is larger than a threshold, for detecting change of a magnetic field by said first permanent magnet provided on said pushbutton when pressing corresponding said pushbutton and changing an output state.

2. A thin switch used in superposition on a display panel having an information display function, comprising:
    a plurality of pushbuttons movable in a press direction at a constant stroke and transparent or translucent;
    bridges arranged in the vicinity of outer sides of at least two opposite edges of each said pushbutton;
    a plurality of first permanent magnets provided on ends of respective said pushbuttons on the sides facing said bridges respectively;
    a plurality of magnetic bodies or a plurality of second permanent magnets provided on portions above said bridges opposed to respective said first permanent magnets respectively; and
    a plurality of Hall element integrated circuits provided on said bridges on the sides facing said first permanent magnets in correspondence to respective said pushbuttons respectively, wherein
        each said magnetic body or each said second permanent magnet structures return means generating returning force in each said pushbutton by attractive force generated between the same and corresponding each said first permanent magnet while causing a click feeling when pressing each said pushbutton along with corresponding said first permanent magnet, and
        each said Hall element integrated circuit has a Hall element and a determination circuit determining whether or not its Hall voltage is larger than a threshold respectively, for detecting change of a magnetic field by each said first permanent magnet provided on said pushbutton when pressing corresponding each said pushbutton and changing an output state.

3. A display panel provided with a switch performing display output and acceptance of switch input, comprising:
- a display panel having an information display function;
- a pushbutton arranged on said display panel, movable in a press direction at a constant stroke and transparent or translucent;
- a bridge arranged in the vicinity of outer sides of at least two opposite edges of said pushbutton;
- a first permanent magnet provided on an end of said pushbutton on the side facing said bridge;
- a magnetic body or a second permanent magnet provided on an upper portion of said bridge opposed to said first permanent magnet; and
- a Hall element integrated circuit provided on said bridge on the side facing said first permanent magnet in correspondence to said pushbutton, wherein
- said magnetic body or said second permanent magnet structures return means generating returning force in said pushbutton by attractive force generated between the same and said first permanent magnet while causing a click feeling when pressing said pushbutton along with said first permanent magnet, and
- said Hall element integrated circuit has a Hall element and a determination circuit determining whether or not its Hall voltage is larger than a threshold, for detecting change of a magnetic field by said first permanent magnet provided on said pushbutton when pressing corresponding said pushbutton and changing an output state.

* * * * *